US012628296B2

(12) United States Patent (10) Patent No.: US 12,628,296 B2
Shen et al. (45) Date of Patent: May 12, 2026

(54) HINGE MECHANISM AND ELECTRONIC DEVICE

(71) Applicant: HUAWEI TECHNOLOGIES CO., LTD., Shenzhen (CN)

(72) Inventors: Hewen Shen, Dongguan (CN); Wen Fan, Dongguan (CN); Ding Zhong, Dongguan (CN); Li Liao, Dongguan (CN); Xuechan Wang, Dongguan (CN); Lei Yu, Dongguan (CN)

(73) Assignee: Huawei Technologies Co., LTD., Shenzhen (CN)

( * ) Notice: Subject to any disclaimer, the term of this patent is extended or adjusted under 35 U.S.C. 154(b) by 82 days.

(21) Appl. No.: 18/905,602

(22) Filed: Oct. 3, 2024

(65) Prior Publication Data

US 2025/0027531 A1 Jan. 23, 2025

Related U.S. Application Data

(63) Continuation of application No. PCT/CN2024/078193, filed on Feb. 22, 2024.

(30) Foreign Application Priority Data

Mar. 31, 2023 (CN) .......................... 202310383872.X

(51) Int. Cl.
*H05K 5/02* (2006.01)
*G06F 1/16* (2006.01)
(52) U.S. Cl.
CPC ......... *H05K 5/0226* (2013.01); *G06F 1/1616* (2013.01); *G06F 1/1652* (2013.01); *G06F 1/1681* (2013.01)

(58) Field of Classification Search
CPC .. H05K 5/0226; H04M 1/0268; G06F 1/1652; G06F 1/1616; G06F 1/1618; G06F 1/1681; G06F 1/1656
See application file for complete search history.

(56) References Cited

U.S. PATENT DOCUMENTS

| | | | | |
|---|---|---|---|---|
| 11,294,431 B2* | 4/2022 | Torres | ................... | G06F 1/1681 |
| 12,047,521 B2* | 7/2024 | Liao | .................... | H04M 1/0216 |
| 12,173,541 B2* | 12/2024 | Chung | ................. | G06F 1/1681 |
| 12,531,939 B2* | 1/2026 | Kim | .................... | H04M 1/0216 |
| 2021/0018960 A1 | 1/2021 | Kato et al. | | |
| 2021/0208641 A1* | 7/2021 | Huang | ................. | H04M 1/022 |
| 2023/0409090 A1* | 12/2023 | Hong | .................... | G06F 1/1616 |

OTHER PUBLICATIONS

International Search Report and Written Opinion in International Appln. No. PCT/CN2024/078193, mailed on Apr. 28, 2024, 12 pages (with partial English translation).

* cited by examiner

*Primary Examiner* — Sagar Shrestha
(74) *Attorney, Agent, or Firm* — Fish & Richardson P.C.

(57) ABSTRACT

This application provides a hinge mechanism and an electronic device. One example hinge mechanism includes a base, and a first rotating assembly and a second rotating assembly that are respectively disposed on two sides of the base. When the first rotating assembly and the second rotating assembly rotate toward each other, a length of the hinge mechanism may be increased; or when the first rotating assembly and the second rotating assembly rotate opposite to each other, a length of the hinge mechanism may be shortened, and a support surface for supporting a flexible display can be formed.

20 Claims, 8 Drawing Sheets

HINGE MECHANISM AND ELECTRONIC DEVICE

CROSS-REFERENCE TO RELATED APPLICATIONS

This application is a continuation of International Application No. PCT/CN2024/078193, filed on Feb. 22, 2024, which claims priority to Chinese Patent Application No. 202310383872.X, filed on Mar. 31, 2023. The disclosures of the aforementioned applications are hereby incorporated by reference in their entireties.

TECHNICAL FIELD

This application relates to the field of electronic device technologies, and in particular, to a hinge mechanism and an electronic device.

BACKGROUND

With gradual maturation of flexible display technologies, a display mode of an electronic device changes greatly. A mobile phone with a foldable flexible display, a tablet computer with a foldable flexible display, a wearable electronic device with a foldable flexible display, and the like are an important evolution direction of intelligent electronic devices in the future.

An existing foldable electronic device includes a flexible display and a hinge, and the flexible display is unfolded and folded through the hinge. In addition to changing a folding state of the electronic device, the hinge is further configured to provide support for the flexible display of the electronic device in different folding states. An inward foldable electronic device is used as an example. In a folding or unfolding process, the flexible display is located on an inner side of rotation of the hinge. Because a rotation radius of the flexible display is less than a rotation radius of the hinge, the flexible display is prone to be pulled or arched. Consequently, the flexible display is damaged after being used for a long time.

In addition, the current hinge usually includes a rotating assembly and a sliding assembly. The rotating assembly is configured to fold and unfold the hinge, and the sliding assembly is configured to limit a rotation direction of the rotating assembly. However, a structure of such a hinge is complex, a requirement on manufacturing precision is high, and manufacturing costs are high.

SUMMARY

This application provides a hinge mechanism and an electronic device, so that a rotating assembly implements both rotation and sliding functions, to reduce a quantity of parts of the hinge mechanism.

According to a first aspect, this application provides a hinge mechanism. The hinge mechanism includes a base, a first rotating assembly, and a second rotating assembly, where the first rotating assembly and the second rotating assembly are respectively disposed on two sides of the base. Specifically, the first rotating assembly includes a first rotating shaft, a first rotating member, a first sliding member, and a first housing support. The first rotating shaft is disposed on a side of the base. The first rotating member is rotatably connected to the base through the first rotating shaft. An end of the first sliding member is rotatably connected to the base, another end of the first sliding member is slidably connected to the first rotating member, and the first sliding member is capable of sliding relative to the first rotating member in a direction parallel to the first rotating shaft. The first housing support is slidably connected to the first rotating member, and the first housing support is capable of sliding relative to the first rotating member in a direction perpendicular to the first rotating shaft. The first sliding member is provided with a first spiral rotating part, and a first spiral groove is provided on a side that is of the base and that is close to the first sliding member. The first spiral rotating part is accommodated in the first spiral groove and rotates in the first spiral groove, so that the first sliding member slides relative to the first rotating member in the direction parallel to the first rotating shaft. One of the first housing support and the first sliding member is provided with a first slanting groove, the other of the first housing support and the first sliding member is provided with a first protrusion, and the first protrusion is capable of sliding in the first slanting groove, to push the first housing support to slide relative to the first rotating member in a direction away from the base when the first rotating assembly and the second rotating assembly rotate toward each other. Specifically, the first housing support is provided with the first slanting groove, the first sliding member is further provided with the first protrusion, and the first protrusion is limited in the first slanting groove.

Correspondingly, the second rotating assembly includes a second rotating shaft, a second rotating member, a second sliding member, and a second housing support. The second rotating shaft is disposed on another side of the base, and the second rotating shaft and the first rotating shaft are disposed in parallel. The second rotating member is rotatably connected to the base through the second rotating shaft. An end of the second sliding member is rotatably connected to the base, and another end of the second sliding member is slidably connected to the second rotating member. The second housing support is slidably connected to the second rotating member. The second sliding member is provided with a second spiral rotating part, a second spiral groove is provided on a side that is of the base and that is close to the second sliding member, and the second spiral rotating part is accommodated in the second spiral groove and rotates in the second spiral groove, so that the second sliding member slides relative to the second rotating member in the direction parallel to the second rotating shaft. One of the second housing support and the second sliding member is provided with a second slanting groove, the other of the second housing support and the second sliding member is provided with a second protrusion, and the second protrusion is capable of sliding in the second slanting groove, to push the second housing support to slide relative to the second rotating member in a direction away from the base when the first rotating assembly and the second rotating assembly rotate toward each other. Specifically, the second housing support is provided with the second slanting groove, the second sliding member is further provided with the second protrusion, and the second protrusion is limited in the second slanting groove.

When the hinge mechanism is folded, the first rotating assembly and the second rotating assembly rotate toward each other, the first rotating member rotates around the first rotating shaft, and the first sliding member rotates relative to the base. In addition, the first sliding member slides, by using the first spiral rotating part and the first spiral groove, relative to the first rotating member in the direction parallel to the first rotating shaft. In a sliding process of the first sliding member, the first protrusion simultaneously slides in the first slanting groove, to push the first housing support to slide relative to the first rotating member in the direction away from the base. Correspondingly, the second rotating member rotates around the second rotating shaft, and the second sliding member rotates relative to the base. In addition, the second sliding member slides, by using the second spiral rotating part and the second spiral groove, relative to the second rotating member in the direction parallel to the second rotating shaft. In a sliding process of the second sliding member, the second protrusion simultaneously slides in the second slanting groove, to push the second housing support to slide relative to the second rotating member in the direction away from the base. Both the first housing support and the second housing support slide in the directions away from the base, so that a length of the hinge mechanism is increased. This ensures that a flexible display is not squeezed.

When the hinge mechanism is unfolded, the first rotating assembly and the second rotating assembly rotate opposite to each other, the first rotating member rotates around the first rotating shaft, and the first sliding member rotates relative to the base and slides relative to the first rotating member in the direction parallel to the first rotating shaft, so that the first protrusion slides in the first slanting groove, to push the first housing support to slide relative to the first rotating member in a direction close to the base. The second rotating member rotates around the second rotating shaft, and the second sliding member rotates relative to the base and slides relative to the second rotating member in the direction parallel to the second rotating shaft, so that the second protrusion slides in the second slanting groove, to push the second housing support to slide relative to the second rotating member in a direction close to the base. Both the first housing support and the second housing support slide in the directions close to the base, so that a length of the hinge mechanism is shortened. This ensures that the flexible display is not pulled.

In the hinge mechanism in this application, when the hinge mechanism is folded, the length of the hinge mechanism may be increased in a direction perpendicular to the base, and the first housing support, the second housing support, and the base may enclose the accommodation space. When the hinge mechanism is unfolded, the length of the hinge mechanism may be shortened in a direction perpendicular to the base, and the first housing support, the second housing support, and the base may be unfolded and form a support surface. In both the folding process and the unfolding process, the hinge mechanism does not exert an action force like a tensile force or a compression force on the flexible display. This can improve a use effect and security of an electronic device. In addition, the first rotating assembly and the second rotating assembly may respectively limit rotation directions. This can reduce a quantity of parts of the hinge mechanism, and then simplify a structure of the hinge mechanism. In addition, because the structure of the hinge mechanism is simple, when the hinge mechanism is in the folded state, screen accommodation space for accommodating the flexible display also becomes larger, and then screen accommodation can be better performed. This prevents a fold from appearing in the flexible display.

In the hinge mechanism, a hinge module may further include a sliding connection member. A first limiting notch is provided on a side that is of the first sliding member and that is close to the first rotating shaft, and an end of the sliding connection member is limited in the first limiting notch and sleeved on the first rotating shaft. A second limiting notch is provided on a side that is of the second sliding member and that is close to the second rotating shaft, and another end of the sliding connection member is limited in the second limiting notch and sleeved on the second rotating shaft. When the first rotating assembly and the second rotating assembly rotate toward or opposite to each other, at least one of the first sliding member and the second sliding member may push the sliding connection member to slide in a same direction on the first rotating shaft and the second rotating shaft. Further, the sliding connection member slides on the first rotating shaft and the second rotating shaft, to push the first sliding member and the second sliding member to synchronously slide in a same direction, and then synchronous motion of the first rotating assembly and the second rotating assembly is implemented. Due to a combination design of the spiral grooves, the first rotating assembly and the second rotating assembly that have a folding structure feature may be combined with the sliding connection member to implement synchronous motion, and no complex synchronization module needs to be added. This can further reduce a quantity of parts of the hinge mechanism, and simplify a structure of the hinge mechanism.

A shape of the sliding connection member in the hinge mechanism is not specifically limited. For example, the sliding connection member may be in a cross shape or a straight shape.

In the hinge mechanism in this application, a sliding connection between the first rotating member and the first sliding member may be implemented by using a sliding groove and a sliding part. Specifically, in a technical solution, the first sliding member may be provided with a first sliding groove parallel to the first rotating shaft, and the first rotating member is provided with a first sliding part. The first sliding part is accommodated in the first sliding groove and slides in the first sliding groove, to implement the sliding connection between the first rotating member and the first sliding member. Correspondingly, the second sliding member may be provided with a second sliding groove parallel to the second rotating shaft, and the second rotating member is provided with a second sliding part. The second sliding part is accommodated in the second sliding groove and slides in the second sliding groove, to implement a sliding connection between the second rotating member and the second sliding member. Certainly, locations of the sliding parts and the sliding grooves are not limited to the foregoing technical solution. For example, in another technical solution, the first rotating member is provided with a third sliding groove parallel to the first rotating shaft, and the first sliding member is further provided with a third sliding part. The third sliding part is accommodated in the third sliding slot and slides in the third sliding groove, to implement the sliding connection between the first rotating member and the first sliding member. The second rotating member is provided with a fourth sliding groove parallel to the second rotating shaft, and the second sliding member is further provided with a fourth sliding part. The fourth sliding part is accommodated in the fourth sliding groove and slides in the fourth sliding groove, to implement a sliding connection between the second rotating member and the second sliding member.

In the technical solution of this application, to improve space utilization and implement miniaturization of the hinge mechanism, the first rotating member and the second rotating member may be of frame structures. Specifically, the first rotating member includes a first frame body and a first rotating part. The first frame body encloses a first hollow area, and the first frame body is separately slidably connected to the first sliding member and the first housing support. The first rotating part is disposed on a side that is of the first frame body and that is close to the base, and is rotatably connected to the first rotating shaft. The first sliding member includes a first sliding block body. The first sliding block body is disposed in the first hollow area of the first frame body, and the first spiral rotating part is disposed on a side that is of the first sliding block body and that is close to the base. When the first rotating member and the first sliding member rotate relative to the base, the first sliding member moves in the first hollow area in the direction parallel to the first rotating shaft.

Correspondingly, the second rotating member may include a second frame body and a second rotating part. The second frame body encloses a second hollow area, and the second frame body is separately slidably connected to the second sliding member and the second housing support. The second rotating part is disposed on a side that is of the second frame body and that is close to the base, and is rotatably connected to the second rotating shaft. The second sliding member includes a second sliding block body. The second sliding block body is disposed in the second hollow area of the second frame body, and the second spiral rotating part is disposed on a side that is of the second sliding block body and that is close to the base. When the second rotating member and the second sliding member rotate relative to the base, the second sliding member moves in the second hollow area in the direction parallel to the second rotating shaft.

In the foregoing technical solution, the first protrusion may be disposed on the first sliding block body of the first sliding member, and the first protrusion passes through the first hollow area and is slidably connected to the first slanting groove. The second protrusion may be disposed on the second sliding block body of the second sliding member, and the second protrusion passes through the second hollow area and is slidably connected to the second slanting groove.

In addition, shapes of the first protrusion and the second protrusion may not be specifically limited. For example, a shape of a cross section that is of the first protrusion and that is parallel to the first sliding block body may be a circle, an ellipse, or a rectangle; and a shape of a cross section that is of the second protrusion and that is parallel to the second sliding block body may be a circle, an ellipse, or a rectangle.

In the hinge mechanism, the first slanting groove extends in a direction away from the base from a side close to the base to a side away from the base, and may form a first included angle with the first rotating shaft, where the first included angle is an acute angle. When the first sliding member slides in the direction parallel to the first rotating shaft, the first included angle is formed between a moving track of the first protrusion and the base. To be specific, the moving track of the first protrusion includes a first track component in the direction parallel to the first rotating shaft and a second track component in the direction perpendicular to the base. The second track component of the first protrusion may push the first housing support to move relative to the first rotating member in the direction close to or away from the base. Correspondingly, the second slanting groove extends in a direction away from the base, and may form a second included angle with the second rotating shaft, where the second included angle is an acute angle. When the second sliding member slides in the direction parallel to the second rotating shaft, the second included angle is formed between a moving track of the second protrusion and the base. To be specific, the moving track of the second protrusion includes a third track component in the direction parallel to the second rotating shaft and a fourth track component in the direction perpendicular to the base. The fourth track component of the second protrusion may push the second housing support to move relative to the second rotating member in the direction close to or away from the base. In this way, it can be ensured that the flexible display maintains a constant length in a folding process and unfolding process, and the flexible display is not pulled or arched. Specifically, when the first rotating assembly and the second rotating assembly rotate toward each other, the first protrusion slides in the first slanting groove in a direction close to the base, and the second protrusion slides in the second slanting groove in a direction close to the base.

When the sliding connection between the first housing support and the first rotating member is specifically disposed, the first housing support may be further provided with a first limiting sliding groove, where the first limiting sliding groove extends in a direction away from the base. The first rotating member is provided with a first limiting sliding part. The first limiting sliding part is accommodated in the first limiting sliding groove and is capable of sliding in the first limiting sliding groove, to implement the sliding connection between the first housing support and the first rotating member. Correspondingly, the second housing support may be further provided with a second limiting sliding groove, where the second limiting sliding groove extends in a direction away from the base. The second rotating member is provided with a second limiting sliding part. The second limiting sliding part is accommodated in the second limiting sliding groove and is capable of sliding in the second limiting sliding groove, to implement the sliding connection between the second housing support and the second rotating member.

Certainly, specific locations of the limiting sliding grooves and the limiting sliding parts are not limited. For example, in another technical solution, the first housing support may be provided with a third limiting sliding part, the first rotating member may be provided with a third limiting sliding groove, and the third limiting sliding groove extends in a direction away from the base. The third limiting sliding part is accommodated in the third limiting sliding groove and slides in the third limiting sliding groove, to implement the sliding connection between the first housing support and the first rotating member. Correspondingly, the second housing support may be provided with a fourth limiting sliding part, the second rotating member may be provided with a fourth limiting sliding groove, and the fourth limiting sliding groove extends in a direction away from the base. The fourth limiting sliding part is accommodated in the fourth limiting sliding groove and is capable of sliding in the fourth limiting sliding groove, to implement the sliding connection between the second housing support and the second rotating member.

In addition, the hinge mechanism may further include a first door plate and a second door plate that are oppositely disposed on the two sides of the base. The first door plate and the second door plate are configured to provide support for the flexible display. Specifically, the first door plate is rotatably connected to the first housing support and slidably connected to the first rotating member. The second door plate is rotatably connected to the second housing support and slidably connected to the second rotating member. When the first rotating assembly and the second rotating assembly rotate toward each other, the first door plate may rotate relative to the first housing support and slide relative to the first rotating member, and the second door plate rotates relative to the second housing support and slides relative to the second rotating member. In this way, when the hinge mechanism is in the folded state, the first door plate and the second door plate each are disposed at an included angle with the base, so that the first door plate, the second door plate, and the base enclose triangle-like space, and then a part of the flexible display is accommodated in the space in a water drop shape.

There is a first support surface on a side that is of the first door plate and that faces the flexible display, there is a second support surface on a side that is of the second door plate and that faces the flexible display, and there is a third support surface on a side that is of the base and that faces the flexible display. When the hinge mechanism is in an unfolded state, the first support surface, the second support surface, and the third support surface may form a flat support surface for supporting the flexible display. When the hinge mechanism is actually used in the electronic device, the flexible display may be disposed on a side of the hinge mechanism, and continuously cover the first housing support, the first door plate, the base, the second door plate, and the second housing support. In this way, the first support surface, the second support surface, and the third support surface provide good support for the flexible display. This prevents the flexible display from being depressed or arched.

When the first door plate and the second door plate are specifically disposed, a first arc-shaped rotating block is provided on a side that is of the first door plate and that is away from the flexible display, and a first arc-shaped guiding groove is provided on a side that is of the first housing support and that faces the first door plate. The first arc-shaped rotating block may be accommodated in the first arc-shaped guiding groove and slide in the first arc-shaped guiding groove, to implement a rotating connection between the first door plate and the first housing support. Correspondingly, a second arc-shaped rotating block is provided on a side that is of the second door plate and that is away from the flexible display, and a second arc-shaped guiding groove is provided on a side that is of the second housing support and that faces the second door plate. The second arc-shaped rotating block is accommodated in the second arc-shaped guiding groove and slides in the second arc-shaped guiding groove, to implement a rotating connection between the second door plate and the second housing support. When the first housing support and the second housing support are folded toward each other or unfolded, the first door plate and the second door plate are also folded or unfolded along with the first housing support and the second housing support.

A first track groove may be further provided on the side that is of the first door plate and that is away from the flexible display, and the first rotating member is provided with a first pin. The first pin is accommodated in the first track groove and slides in the first track groove, to drive the first door plate to move relative to the first housing support. Correspondingly, a second track groove may be further provided on the side that is of the second door plate and that is away from the flexible display, and the second rotating member is provided with a second pin. The second pin is accommodated in the second track groove and slides in the second track groove, to drive the second door plate to move relative to the second housing support.

According to a second aspect, this application provides an electronic device. The electronic device includes a flexible display, a first housing, a second housing, and the hinge mechanism according to the first aspect. Specifically, the first housing and the second housing are respectively disposed on two opposite sides of a base, the first housing is fastened to a first housing support, the second housing is fastened to a second housing support, and a flexible display continuously covers the first housing, the second housing, and the hinge mechanism, and is separately fastened to the first housing and the second housing.

When the electronic device is folded, the first housing and the second housing rotate toward each other, and under an action of the first housing support and the second housing support, the first housing and the second housing translate in directions away from the base. This can avoid a compression force exerted on the flexible display. When the electronic device is unfolded, the first housing and the second housing rotate opposite to each other, and under an action of the first housing support and the second housing support, the first housing and the second housing translate in directions close to the base. This can avoid a tensile force exerted on the flexible display. In addition, in a folding process, the hinge mechanism may form space for accommodating the flexible display, so that the flexible display is accommodated in the space in a water drop shape. This can prevent the flexible display from being squeezed and undesirable phenomena such as a crease from occurring. In addition, the hinge mechanism itself may implement a steering limitation. This can reduce a quantity of parts of the hinge mechanism, and simplify a structure of the electronic device.

REFERENCE NUMERALS

Figure 1:
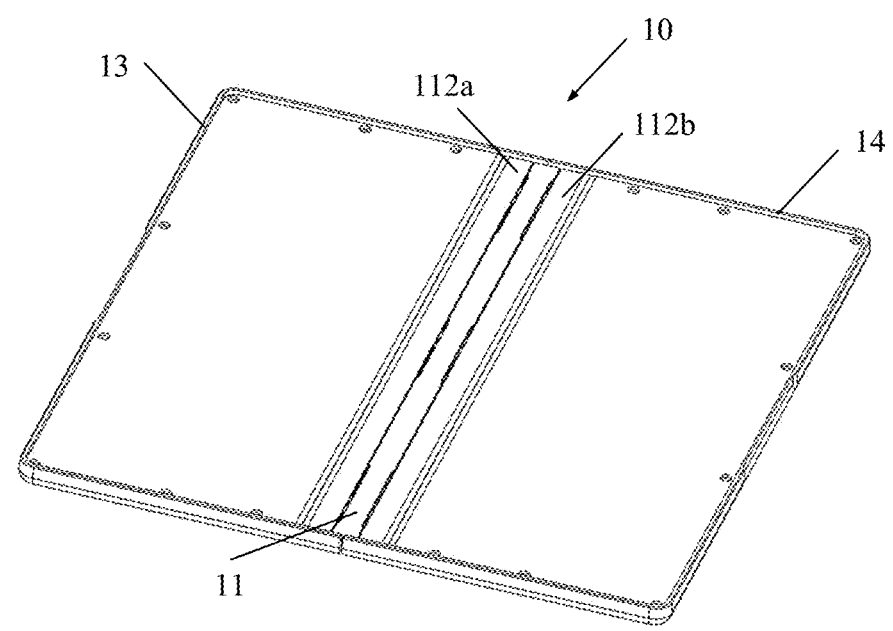
FIG. 1 is a diagram of an electronic device in an unfolded state according to an embodiment of this application.

10: electronic device;
11: hinge mechanism;
12: flexible display;
13: first housing;
14: second housing;
110: base;
111: hinge module;
112a: first door plate;

112*b*: second door plate;
1101*a*: first spiral groove;
1101*b*: second spiral groove;
1111*a*: first rotating assembly;
1111*b*: second rotating assembly;
1112: sliding connection member;
1112*a*: first end;
1112*b*: second end;
1113*a*: first rotating shaft;
1113*b*: second rotating shaft;
1114*a*: first rotating member;
1114*b*: second rotating member;
1115*a*: first sliding member;
1115*b*: second sliding member;
1116*a*: first housing support;
1116*b*: second housing support;
1117*a*: first spiral rotating part;
1117*b*: second spiral rotating part;
1118*a*: first sliding groove;
1118*b*: second sliding groove;
1119*a*: first sliding part;
1119*b*: second sliding part;
1120*a*: first limiting sliding groove;
1120*b*: second limiting sliding groove;
1121*a*: first slanting groove;
1121*b*: second slanting groove;
1122*a*: first limiting sliding part;
1122*b*: second limiting sliding part;
1123*a*: first protrusion;
1123*b*: second protrusion;
1124*a*: first limiting notch;
1124*b*: second limiting notch;
1125*a*: first arc-shaped rotating block;
1126*a*-first arc-shaped guiding groove;
1127*a*: first track groove;
1127*b*: second track groove;
1128*a*: first pin;
1128*b*: second pin;
1129*a*: first frame body;
1129*b*: second frame body;
1130*a*: first rotating part;
1130*b*: second rotating part;
1131*a*: first hollow area;
1131*b*: second hollow area;
1132*a*: first sliding block body;
1132*b*: second sliding block body.

DESCRIPTION OF EMBODIMENTS

In some current foldable electronic devices, rotation and sliding of hinge mechanisms are implemented by different assemblies. This occupies large space and is not conducive to miniaturization of the foldable electronic devices.

Therefore, this application provides a hinge mechanism and an electronic device, so that a rotating assembly implements both rotation and sliding functions, to reduce a quantity of parts of the hinge mechanism.

It should be noted that, terms used in the following embodiments are merely intended to describe specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

Reference to "an embodiment", "some embodiments", or the like described in this specification indicates that one or more embodiments of this application include a specific feature, structure, or characteristic described with reference to embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "have", and variants thereof all mean "include but are not limited to", unless otherwise specifically emphasized in another manner.

To make the objectives, technical solutions, and advantages of this application clearer, the following further describes this application in detail with reference to the accompanying drawings.

Figure 2:
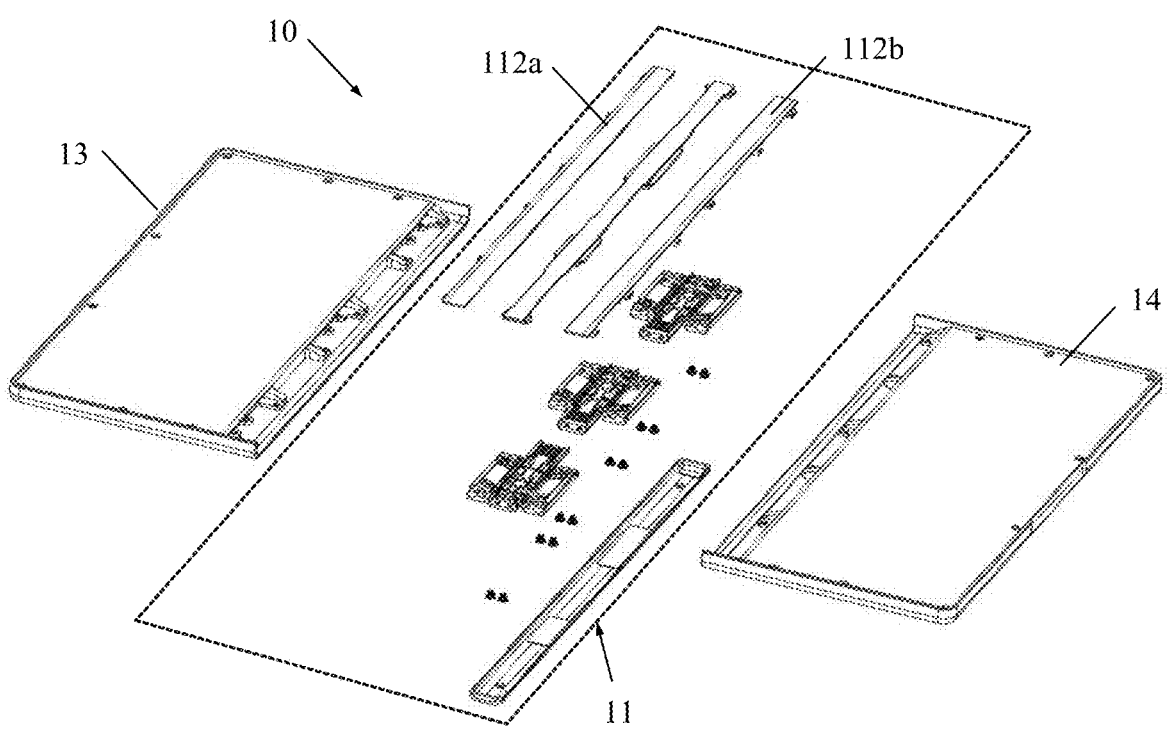
FIG. 2 is a three-dimensional assembly diagram of the electronic device in FIG. 1.
Figure 3:
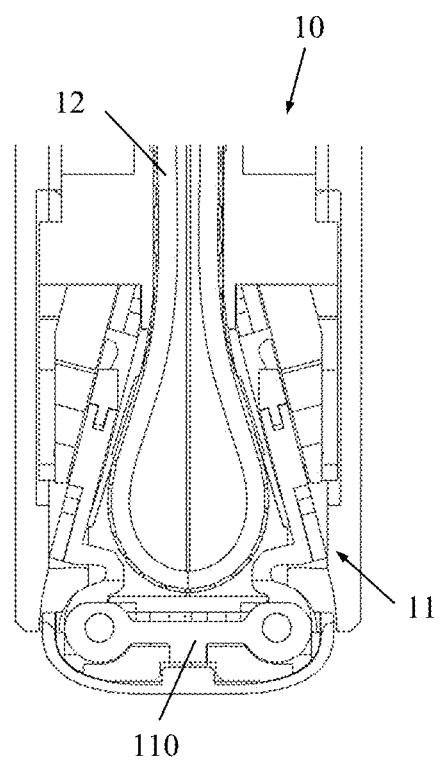
FIG. 3 is a partial diagram of an electronic device in a folded state according to an embodiment of this application.

To facilitate understanding of the hinge mechanism provided in embodiments of this application, the following describes an application scenario of the hinge mechanism. The hinge mechanism may be applied to, but is not limited to, a foldable electronic device, for example, a mobile phone, an intelligent wearable device, a tablet computer, or a notebook computer. When the hinge mechanism provided in embodiments of this application is used in an electronic device, refer to FIG. 1 and FIG. 2. FIG. 1 is a diagram of an electronic device in an unfolded state according to an embodiment of this application. FIG. 2 is a three-dimensional assembly diagram of the electronic device in FIG. 1. An electronic device 10 provided in this application may be an inward foldable electronic device. FIG. 3 is a partial diagram of an electronic device in a folded state according to an embodiment of this application. As shown in FIG. 2 and FIG. 3, in addition to a hinge mechanism 11, the electronic device 10 may further include a flexible display 12, a first housing 13, and a second housing 14. The flexible display 12 is disposed on the hinge mechanism 11. The first housing 13 and the second housing 14 are disposed on two sides of the hinge mechanism 11, and may rotate around the hinge mechanism 11. When being used, the electronic device 10 may be folded and unfolded in different use scenarios. When the electronic device 10 is in an unfolded state, the flexible display 12 is disposed on a same side of the hinge mechanism 11, the first housing 13, and the second housing 14, and is connected to the hinge mechanism 11, the first housing 13, and the second housing 14. In this case, an outer surface that is of the first housing 13 and that is away from the flexible display 12 and an outer surface that is of the second housing 14 and that is away from the flexible display 12 may be jointly used as an appearance surface of the electronic device 10, and the flexible display 12 is configured to display an image. As shown in FIG. 3, when the electronic device 10 is in a folded state, the first housing 13 and the second housing 14 are disposed toward each other, and the flexible display 12 is folded and is in a water drop shape, so that a stress exerted on the flexible display 12 by folding the first housing 13 and the second housing 14 can be reduced. It may be understood that, a process in which the electronic device 10 switches from the unfolded state to the folded state or switches from the folded state to the unfolded state is a process in which the first housing 13 and the second housing 14 rotate around the hinge mechanism 11. In this process, the flexible display 12 is bent or unfolded along with the first housing 13 and the second housing 14.

Figure 4:
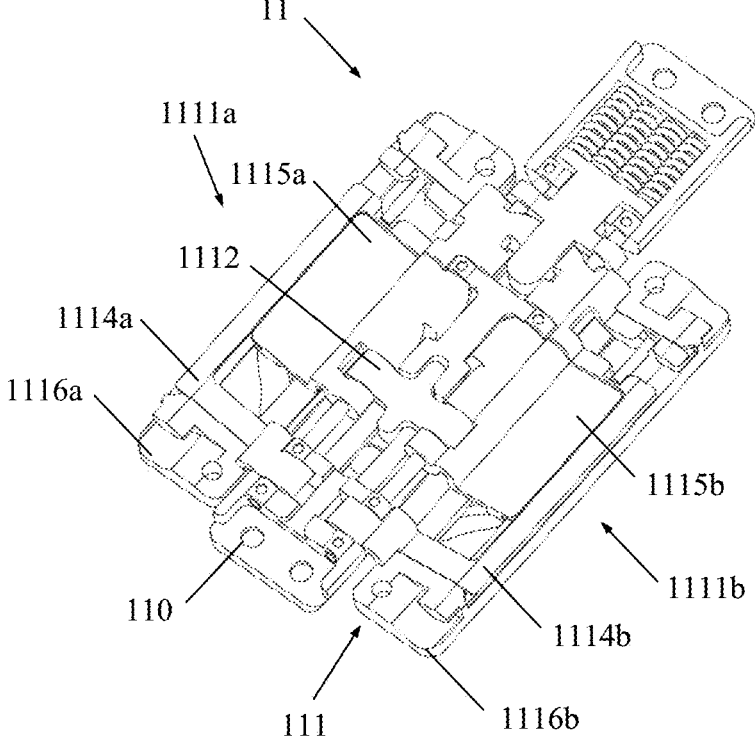
FIG. 4 is a diagram of a structure of a hinge mechanism according to an embodiment of this application.
Figure 5:
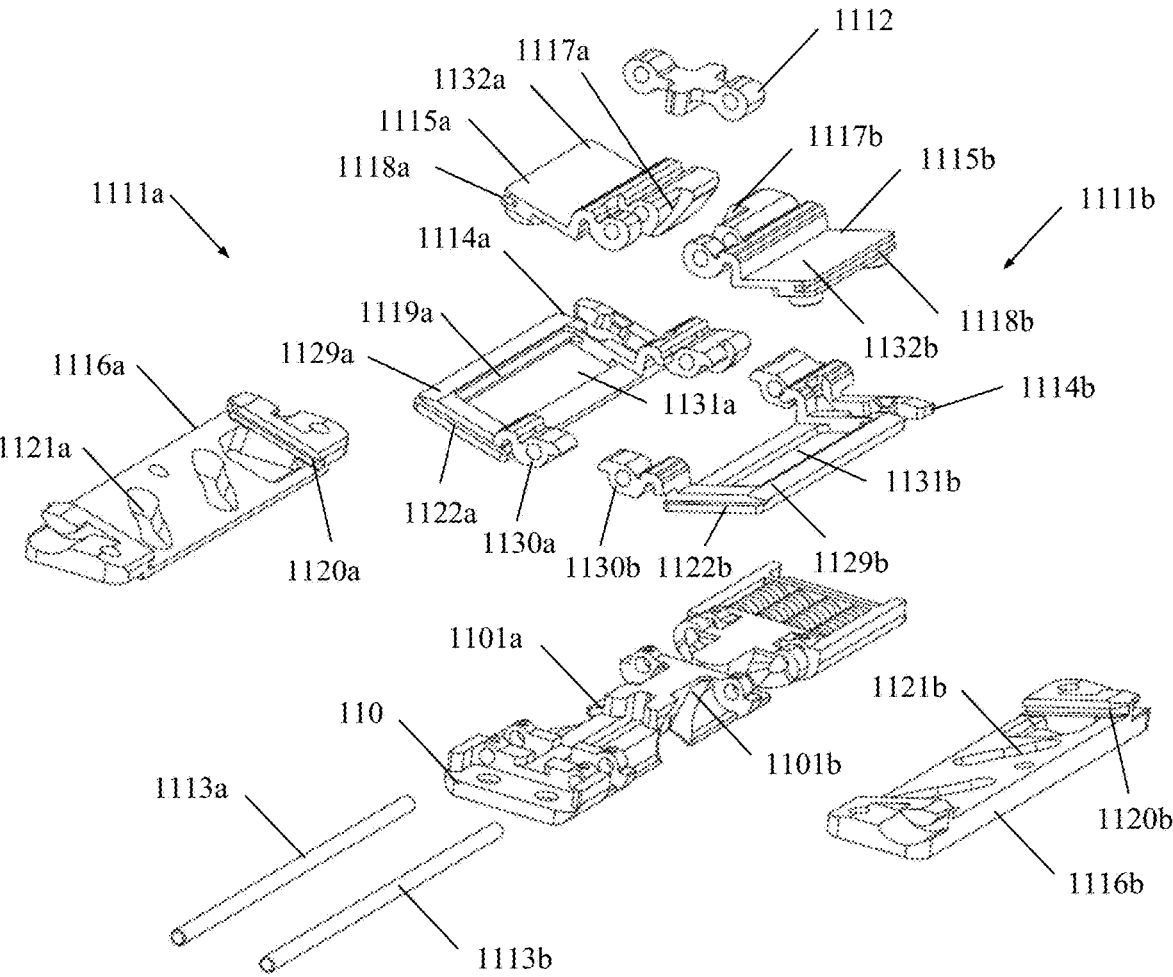
FIG. 5 is a three-dimensional assembly diagram of the hinge mechanism in FIG. 4.
Figure 6:
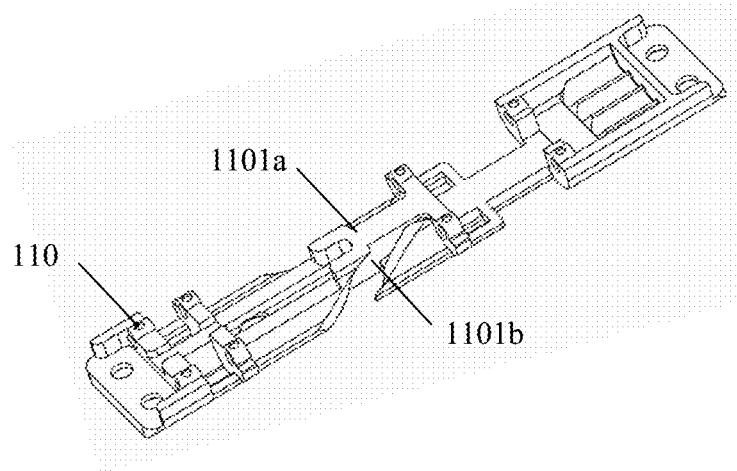
FIG. 6 is a diagram of a structure of a base according to an embodiment of this application.

FIG. 4 is a diagram of a structure of a hinge mechanism according to an embodiment of this application. FIG. 5 is a three-dimensional assembly diagram of the hinge mechanism in FIG. 4. As shown in FIG. 4 and FIG. 5, the hinge mechanism 11 includes a base 110 and at least one hinge module 111. FIG. 6 is a diagram of a structure of a base according to an embodiment of this application. As shown in FIG. 6, the base 110 is provided with a first spiral groove 1101*a* and a second spiral groove 1101*b*. Still as shown in FIG. 5 and FIG. 6, the hinge module 111 may include a first rotating assembly 1111*a* and a second rotating assembly 1111*b*, and the first rotating assembly 1111*a* and the second rotating assembly 1111*b* are respectively disposed on two sides of the base 110. The first rotating assembly 1111*a* may include a first rotating shaft 1113*a*, a first rotating member 1114*a*, a first sliding member 1115*a*, and a first housing support 1116*a*. The first rotating shaft 1113*a* is disposed on a side of the base 110. The first rotating member 1114*a* is rotatably connected to the base 110 through the first rotating shaft 1113*a*. An end of the first sliding member 1115*a* is rotatably connected to the base 110, another end of the first sliding member 1115*a* is slidably connected to the first rotating member 1114*a*, and the first sliding member 1115*a* may slide relative to the first rotating member 1114*a* in a direction parallel to the first rotating shaft 1113*a*. Correspondingly, the second rotating assembly 1111*b* may include a second rotating shaft 1113*b*, a second rotating member 1114*b*, a second sliding member 1115*b*, and a second housing support 1116*b*. The second rotating shaft 1113*b* is disposed on another side of the base 110. The second rotating member 1114*b* is rotatably connected to the base 110 through the second rotating shaft 1113*b*. An end of the second sliding member 1115*b* is rotatably connected to the base 110, another end of the second sliding member 1115*b* is slidably connected to the second rotating member 1114*b*, and the second sliding member 1115*b* may slide relative to the second rotating member 1114*b* in a direction parallel to the second rotating shaft 1113*b*.

Figure 7:
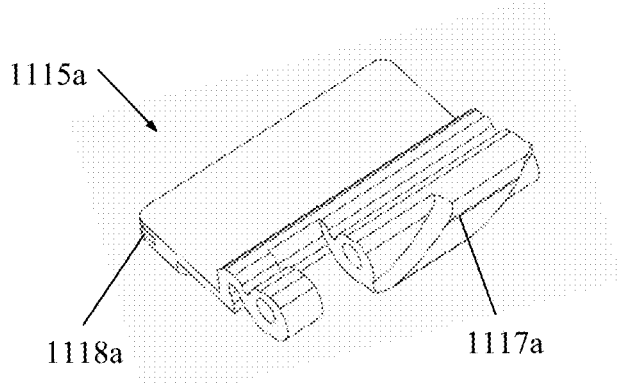
FIG. 7 is a diagram of a structure of a first sliding member according to an embodiment of this application.
Figure 8:
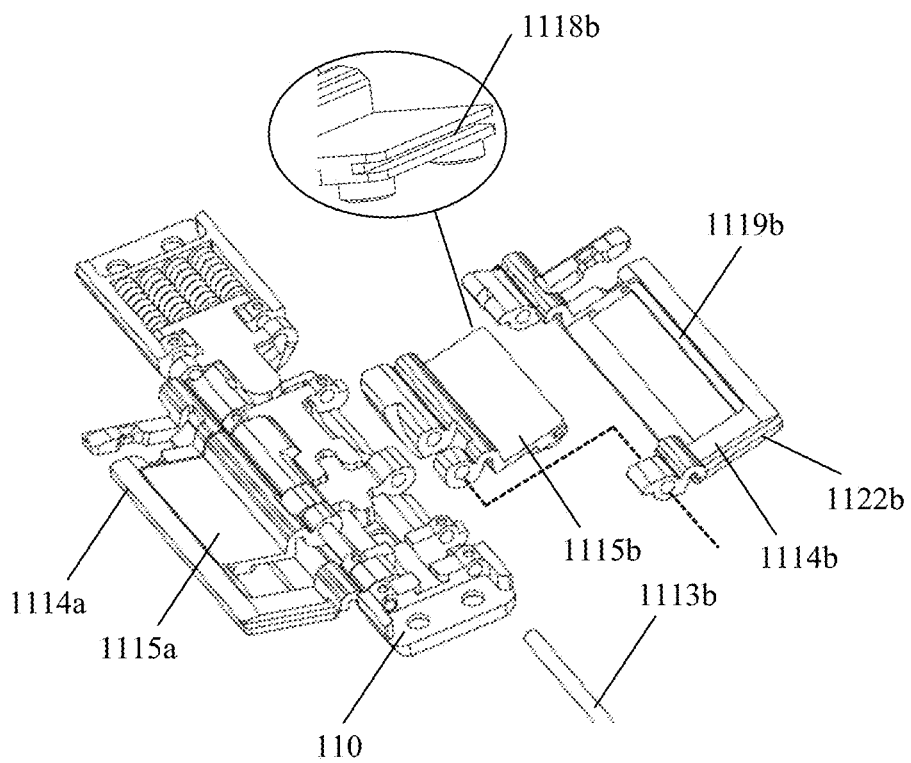
FIG. 8 is a diagram of another structure of a hinge mechanism according to an embodiment of this application.
Figure 9:
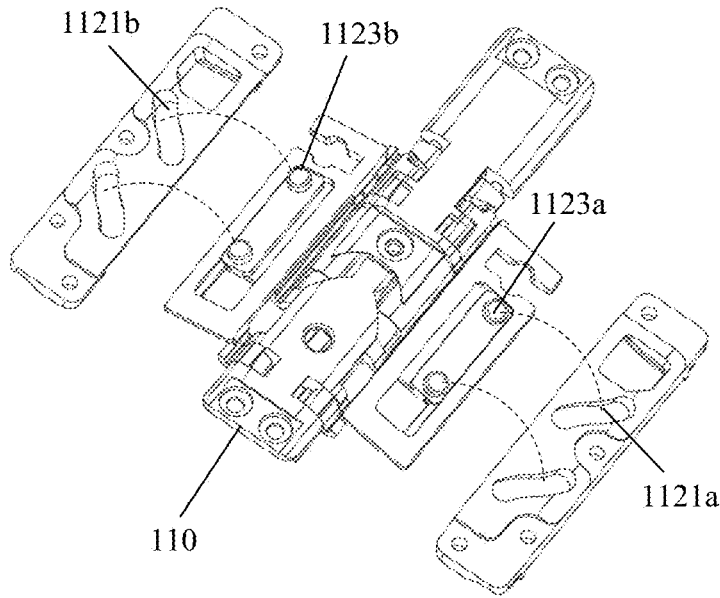
FIG. 9 is a diagram of another structure of a hinge mechanism according to an embodiment of this application.

FIG. 7 is a diagram of a structure of a first sliding member according to an embodiment of this application. FIG. 8 is a diagram of another structure of a hinge mechanism according to an embodiment of this application. As shown in FIG. 7 and FIG. 8, the first sliding member 1115*a* is provided with a first spiral rotating part 1117*a*. As shown in FIG. 5, FIG. 7, and FIG. 8, the first spiral rotating part 1117*a* may be accommodated in the first spiral groove 1101*a* and rotate in the first spiral groove 1101*a*, so that the first sliding member 1115*a* slides relative to the first rotating member 1114*a* in the direction parallel to the first rotating shaft 1113*a*. The first housing support 1116*a* is provided with a first slanting groove 1121*a*. FIG. 9 is a diagram of another structure of a hinge mechanism according to an embodiment of this application. As shown in FIG. 9, the first sliding member 1115*a* is provided with a first protrusion 1123*a*, and the first protrusion 1123*a* is limited in the first slanting groove 1121*a* and may slide in the first slanting groove 1121*a*.

Correspondingly, the second sliding member 1115*b* is provided with a second spiral rotating part 1117*b*. The second spiral rotating part 1117*b* may be accommodated in the second spiral groove 1101*b* and rotate in the second spiral groove 1101*b*, so that the second sliding member 1115*b* slides relative to the second rotating member 1114*b* in the direction parallel to the second rotating shaft 1113*b*. The second housing support 1116*b* is provided with a second slanting groove 1121*b*, and the second sliding member 1115*b* is provided with a second protrusion 1123*b*. The second protrusion 1123*b* is limited in the second slanting groove 1121*b* and may slide in the second slanting groove 1121*b*.

When the hinge mechanism 11 is folded, the first rotating assembly 1111*a* and the second rotating assembly 1111*b* rotate toward each other, the first rotating member 1114*a* rotates around the first rotating shaft 1113*a*, and the first sliding member 1115*a* rotates relative to the base 110. In addition, the first sliding member 1115*a* slides, by using the first spiral rotating part 1117*a* and the first spiral groove 1101*a*, relative to the first rotating member 1114*a* in the direction parallel to the first rotating shaft 1113*a*. In a sliding process of the first sliding member 1115*a*, the first protrusion 1123*a* simultaneously slides in the first slanting groove 1121*a*, to push the first housing support 1116*a* to slide relative to the first rotating member 1114*a* in a direction away from the base 110. The second rotating member 1114*b* rotates around the second rotating shaft 1113*b*, and the second sliding member 1115*b* rotates relative to the base 110. In addition, the second sliding member 1115*b* slides, by using the second spiral rotating part 1117*b* and the second spiral groove 1101*b*, relative to the second rotating member 1114*b* in the direction parallel to the second rotating shaft 1113*b*. In a sliding process of the second sliding member 1115*b*, the second protrusion 1123*b* simultaneously slides in the second slanting groove 1121*b*, to push the second housing support 1116*b* to slide relative to the second rotating member 1114*b* in the direction away from the base 110. Both the first housing support 1116*a* and the second housing support 1116*b* slide in the direction away from the base 110, so that a length of the hinge mechanism 11 is increased. This ensures that the flexible display 12 is not squeezed. In addition, when the hinge mechanism 11 is in a folded state, the first housing support 1116*a*, the second housing support 1116*b*, and the base 110 may enclose accommodation space for accommodating the flexible display 12.

When the hinge mechanism 11 is unfolded, the first rotating assembly 1111*a* and the second rotating assembly 1111*b* rotate opposite to each other, the first rotating member 1114*a* rotates around the first rotating shaft 1113*a*, and the first sliding member 1115*a* rotates relative to the base 110 and slides relative to the first rotating member 1114*a* in the direction parallel to the first rotating shaft 1113*a*, so that the first protrusion 1123*a* slides in the first slanting groove 1121*a*, to push the first housing support 1116*a* to slide relative to the first rotating member 1114*a* in a direction close to the base 110. The second rotating member 1114*b* rotates around the second rotating shaft 1113*b*, and the second sliding member 1115*b* rotates relative to the base 110 and slides relative to the second rotating member 1114*b* in the direction parallel to the second rotating shaft 1113*b*, so that the second protrusion 1123*b* slides in the second slanting groove 1121*b*, to push the second housing support 1116*b* to slide relative to the second rotating member 1114*b* in a direction close to the base 110. Both the first housing support 1116*a* and the second housing support 1116*b* slide in the directions close to the base 110, so that a length of the hinge mechanism 11 is shortened. This ensures that the flexible display 12 is not pulled. In addition, when the hinge mechanism 11 is in an unfolded state, the first housing support 1116*a*, the second housing support 1116*b*, and the base 110 may be unfolded and form a support surface.

In the hinge mechanism 11 in this application, when the hinge mechanism 11 is folded, the length of the hinge mechanism 11 may be increased in a direction perpendicular to the base 110, and the first housing support 1116*a*, the second housing support 1116*b*, and the base 110 may enclose the accommodation space. When the hinge mechanism 11 is unfolded, the length of the hinge mechanism 11 may be shortened in a direction perpendicular to the base 110, and the first housing support 1116*a*, the second housing support 1116*b*, and the base 110 may be unfolded and form the support surface. In both the folding process and the unfolding process, the hinge mechanism 11 does not exert an action force like a tensile force or a compression force on the flexible display 12. This can improve a use effect and security of the electronic device 10. In addition, the first rotating assembly 1111*a* and the second rotating assembly 1111*b* may respectively limit rotation directions. This can reduce a quantity of parts of the hinge mechanism 11, and then simplify a structure of the hinge mechanism 11. In addition, because the structure of the hinge mechanism 11 is simple, when the hinge mechanism 11 is in the folded state, screen accommodation space for accommodating the flexible display 12 also becomes larger, and then screen accommodation can be better performed. This prevents a fold from appearing in the flexible display 12.

In the hinge mechanism 11 in this application, a sliding connection between the first rotating member 1114*a* and the first sliding member 1115*a* may be implemented by using a sliding groove and a sliding part. As shown in FIG. 7 and FIG. 8, the first sliding member 1115*a* may be provided with a first sliding groove 1118*a* parallel to the first rotating shaft 1113*a*. The first rotating member 1114*a* is provided with a first sliding part 1119*a*. The first sliding part 1119*a* may be accommodated in the first sliding groove 1118*a* and rotate in the first sliding groove 1118*a*, to implement the sliding connection between the first rotating member 1114*a* and the first sliding member 1115*a*. Correspondingly, the second sliding member 1115*b* is provided with a second sliding groove 1118*b* parallel to the second rotating shaft 1113*b*. The second rotating member 1114*b* is provided with a second sliding part 1119*b*. The second sliding part 1119*b* may be accommodated in the second sliding groove 1118*b* and slide in the second sliding groove 1118*b*, to implement a sliding connection between the second rotating member 1114*b* and the second sliding member 1115*b*. Certainly, locations of the sliding parts and the sliding grooves are not limited to the foregoing technical solution. For example, in another embodiment, the first sliding member 1115*a* may be provided with a first sliding part 1119*a*, and the first rotating member 1114*a* is provided with a first sliding groove 1118*a* parallel to the first rotating shaft 1113*a*. The second sliding member 1115*b* is provided with a second sliding part 1119*b*, and the second rotating member 1114*b* is provided with a second sliding groove 1118*b* parallel to the second rotating shaft 1113*b*.

In the first housing support 1116*a* and the second housing support 1116*b*, the first slanting groove 1121*a* and the second slanting groove 1121*b* may be symmetrically disposed relative to the base 110, and each are disposed at an acute angle with the base 110, so that the first housing support 1116*a* and the second housing support 1116*b* may separately move in the directions away from the base 110. This can ensure that the flexible display 12 remains a constant length in the folding process and the unfolding process, and prevents the flexible display 12 from being pulled or arched. Specifically, the first slanting groove 1121*a* extends in a direction away from the base 110 from a side close to the base 110 to a side away from the base 110, and may form a first included angle with the first rotating shaft 1113*a*, where the first included angle is an acute angle. When the first sliding member 1115*a* slides in the direction parallel to the first rotating shaft 1113*a*, the first included angle is formed between a moving track of the first protrusion 1123*a* and the base 110. To be specific, the moving track of the first protrusion 1123*a* includes a first track component in the direction parallel to the first rotating shaft 1113*a* and a second track component in the direction perpendicular to the base 110. The second track component of the first protrusion 1123*a* may push the first housing support 1116*a* to move relative to the first rotating member 1114*a* in the direction close to or away from the base 110. Correspondingly, the second slanting groove 1121*b* extends in a direction away from the base 110 from a side close to the base 110 to a side away from the base 110, and may form a second included angle with the second rotating shaft 1113*b*, where the second included angle is an acute angle. When the second sliding member 1115*b* slides in the direction parallel to the second rotating shaft 1113*b*, the second included angle is formed between a moving track of the second protrusion 1123*b* and the base 110. To be specific, the moving track of the second protrusion 1123*b* includes a third track component in the direction parallel to the second rotating shaft 1113*b* and a fourth track component in the direction perpendicular to the base 110. The fourth track component of the second protrusion 1123*b* may push the second housing support 1116*b* to move relative to the second rotating member 1114*b* in the direction close to or away from the base 110. Specifically, when the first rotating assembly 1111*a* and the second rotating assembly 1111*b* rotate toward each other, the first protrusion 1123*a* slides in the first slanting groove 1121*a* in a direction close to the base 110, and the second protrusion 1123*b* slides in the second slanting groove 1121*b* in a direction close to the base 110.

As shown in FIG. 5 and FIG. 8, when a sliding connection between the first housing support 1116*a* and the first rotating member 1114*a* is specifically disposed, the first housing support 1116*a* may be provided with a first limiting sliding groove 1120*a*, where an extension direction of the first limiting sliding groove 1120*a* is perpendicular to the first rotating shaft 1113*a*. The first rotating member 1114*a* may be provided with a first limiting sliding part 1122*a*. The first limiting sliding part 1122*a* may be accommodated in the first limiting sliding groove 1120*a* and slide in the first limiting sliding groove 1120*a*, to implement the sliding connection between the first housing support 1116*a* and the first rotating member 1114*a*. Correspondingly, the second housing support 1116*b* is provided with a second limiting sliding groove 1120*b*, where an extension direction of the second limiting sliding groove 1120*b* is perpendicular to the second rotating shaft 1113*b*. The second rotating member 1114*b* is provided with a second limiting sliding part 1122*b*. The second limiting sliding part 1122*b* may be accommodated in the second limiting sliding groove 1120*b* and slide in the second limiting sliding groove 1120*b*, to implement the sliding connection between the second housing support 1116*b* and the second rotating member 1114*b*. Certainly, specific locations of the limiting sliding grooves and the limiting sliding parts are not limited. For example, in another embodiment, the first housing support 1116*a* may be provided with a first limiting sliding part 1122*a*, and the first rotating member 1114*a* may be provided with a first limiting sliding groove 1120*a*. The second housing support 1116*b* is provided with a second limiting sliding part 1122*b*, and the second rotating member 1114*b* is provided with a second limiting sliding groove 1120*b*.

As shown in FIG. 5, in this embodiment of this application, the first rotating member 1114*a* and the second rotating member 1114*b* may be of frame structures. The first rotating member 1114*a* includes a first frame body 1129*a* and a first rotating part 1130*a*. The first frame body 1129*a* encloses a first hollow area 1131*a*, and the first frame body 1129*a* is separately slidably connected to the first sliding member 1115a and the first housing support 1116a. The first rotating part 1130a is disposed on a side that is of the first frame body 1129a and that is close to the base 110, and is rotatably connected to the first rotating shaft 1113a. The first sliding member 1115a includes a first sliding block body 1132a. The first sliding block body 1132a is disposed in the first hollow area 1131a of the first frame body 1129a, and the first spiral rotating part 1117a is disposed on a side that is of the first sliding block body 1132a and that is close to the base 110. When the first rotating member 1114a and the first sliding member 1115a rotate relative to the base 110, the first sliding member 1115a moves in the first hollow area 1131a in the direction parallel to the first rotating shaft 1113a.

Correspondingly, the second rotating member 1114b may include a second frame body 1129b and a second rotating part 1130b. The second frame body 1129b encloses a second hollow area 1131b, and the second frame body 1129b is separately slidably connected to the second sliding member 1115b and the second housing support 1116b. The second rotating part 1130b is disposed on a side that is of the second frame body 1129b and that is close to the base 110, and is rotatably connected to the second rotating shaft 1113b. The second sliding member 1115b includes a second sliding block body 1132b. The second sliding block body 1132b is disposed in the second hollow area 1131b of the second frame body 1129b, and the second spiral rotating part 1117b is disposed on a side that is of the second sliding block body 1132b and that is close to the base 110. When the second rotating member 1114b and the second sliding member 1115b rotate relative to the base 110, the second sliding member 1115b moves in the second hollow area 1131b in the direction parallel to the second rotating shaft 1113b. In this way, space utilization can be improved, and miniaturization of the hinge mechanism 11 is facilitated.

As shown in FIG. 8, the second rotating assembly 1111b is used as an example. In a process of folding or unfolding the hinge mechanism 11, the second rotating member 1114b and the second sliding member 1115b separately rotate relative to the base 110. In an embodiment, the second rotating shaft 1113b passes through the second spiral groove 1101b, the second spiral rotating part 1117b, and the second rotating part 1130b, and is installed on the base 110. In this embodiment, a rotation axis center of the second rotating member 1114b overlaps a rotation axis center of the second sliding member 1115b. In other words, the second rotating member 1114b and the second sliding member 1115b share one rotation axis center. Certainly, a rotation axis center of the second rotating member 1114b may alternatively not overlap a rotation axis center of the second sliding member 1115b. For example, in another embodiment, the second rotating shaft 1113b passes through the second rotating part 1130b of the second rotating member 1114b, and is installed on the base 110. The second rotating assembly 1111b may further include a third rotating shaft (which is not shown in the figure) parallel to the second rotating shaft 1113b. The third rotating shaft passes through the second spiral groove 1101b and the second spiral rotating part 1117b, and is installed on the base 110. When the second rotating assembly 1111b rotates, the second rotating member 1114b rotates around the second rotating shaft 1113b, and the second sliding member 1115b rotates around the third rotating shaft.

As shown in FIG. 9, in the foregoing technical solution, the first protrusion 1123a may be disposed on the first sliding block body 1132a of the first sliding member 1115a, and the first protrusion 1123a passes through the first hollow area 1131a and is slidably connected to the first slanting groove 1121a. The second protrusion 1123b may be disposed on the second sliding block body 1132b of the second sliding member 1115b, and the second protrusion 1123b passes through the second hollow area 1131b and is slidably connected to the second slanting groove 1121b.

Figure 10:
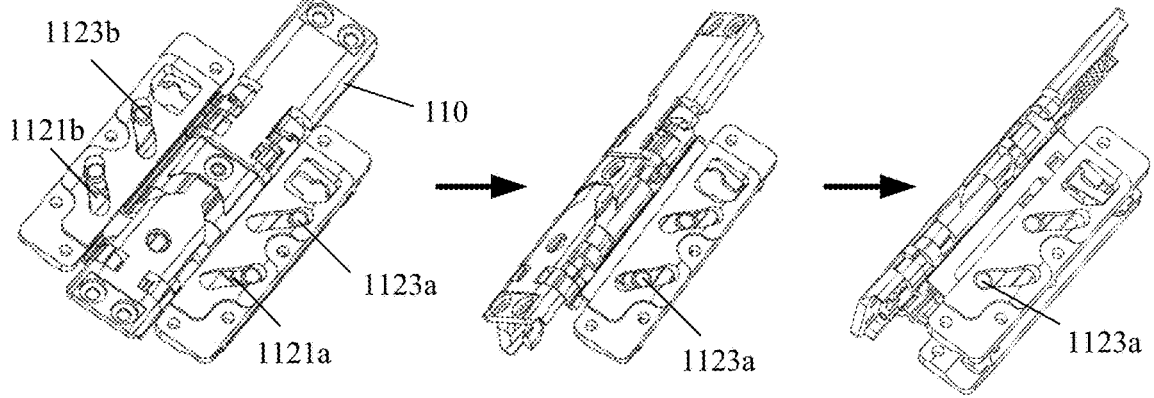
FIG. 10 is a diagram of a folded hinge mechanism according to an embodiment of this application.

FIG. 10 is a diagram of a folded hinge mechanism according to an embodiment of this application. As shown in FIG. 10, when the first rotating assembly 1111a and the second rotating assembly 1111b are folded toward each other, the first protrusion 1123a slides toward the base 110 from an end that is of the first slanting groove 1121a and that is away from the base 110, and the second protrusion 1123b slides toward the base 110 from an end that is of the second slanting groove 1121b and that is away from the base 110, to push the first housing support 1116a and the second housing support 1116b to move in the direction perpendicular to the base 110. Therefore, in a process of folding and unfolding the electronic device 10, the first housing support 1116a and the second housing support 1116b may move toward the base 110 or move in a direction away from the base 110, so that a length of the hinge mechanism 11 in the direction perpendicular to the base 110 may be increased, to adapt to a location change of a neutral layer of the flexible display 12 in the folding or unfolding process, and then prevent the flexible display 12 from being arched or pulled in the process.

In addition, shapes of the first protrusion 1123a and the second protrusion 1123b may not be specifically limited. For example, a shape of a cross section that is of the first protrusion 1123a and that is parallel to the first sliding block body 1132a may be a circle, an ellipse, or a rectangle. A shape of a cross section that is of the second protrusion 1123b and that is parallel to the second sliding block body 1132b may be a circle, an ellipse, or a rectangle.

As shown in FIG. 4 and FIG. 5, the hinge module 111 may further include a sliding connection member 1112. The sliding connection member 1112 is disposed between the first rotating assembly 1111a and the second rotating assembly 1111b, where a first end 1112a of the sliding connection member 1112 is sleeved on the first rotating shaft 1113a and may slide along the first rotating shaft 1113a. A second end 1112b of the sliding connection member 1112 is sleeved on the second rotating shaft 1113b and may slide along the second rotating shaft 1113b. The first sliding member 1115a is connected to the first end 1112a, and the second sliding member 1115b is connected to the second end 1112b. A shape of the sliding connection member 1112 is not specifically limited. For example, the sliding connection member 1112 may be in a cross shape or a straight shape.

Figure 11:
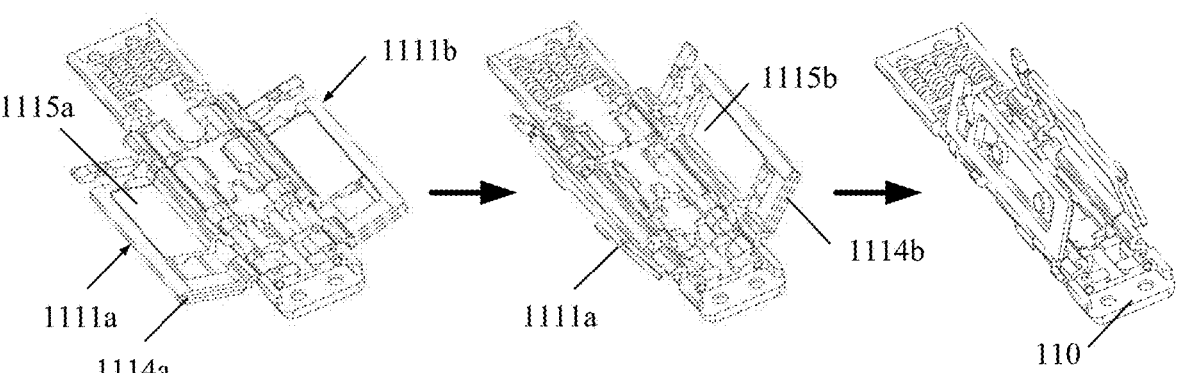
FIG. 11 is a diagram of another folded hinge mechanism according to an embodiment of this application.

FIG. 11 is a diagram of another folded hinge mechanism according to an embodiment of this application. As shown in FIG. 11, when the first rotating assembly 1111a and the second rotating assembly 1111b are folded toward each other, the first rotating member 1114a rotates around the first rotating shaft 1113a, to drive the first sliding member 1115a to rotate relative to the base 110 and simultaneously slide along the first rotating shaft 1113a. The second rotating member 1114b rotates around the second rotating shaft 1113b, to drive the second sliding member 1115b to rotate relative to the base 110 and simultaneously slide along the second rotating shaft 1113b. The first sliding member 1115a slides along the first rotating shaft 1113a to drive the sliding connection member 1112 to slide along the first rotating shaft 1113a, and the second sliding member 1115b slides along the second rotating shaft 1113b to drive the sliding connection member 1112 to slide along the second rotating shaft 1113b. Because the sliding connection member 1112 slides along both the first rotating shaft 1113a and the second rotating shaft 1113*b*, the first sliding member 1115*a* and the second sliding member 1115*b* may be pushed to synchronously slide, so that the first rotating member 1114*a* and the second rotating member 1114*b* synchronously rotate relative to the base 110. Therefore, the first rotating assembly 1111*a* and the second rotating assembly 1111*b* that have a folding structure feature may be combined with the sliding connection member 1112 by using a combination design of the spiral grooves to implement synchronous motion, and no complex synchronization module needs to be added. This can reduce a quantity of parts of the hinge mechanism 11, and simplify a structure of the hinge mechanism 11.

Figure 12:
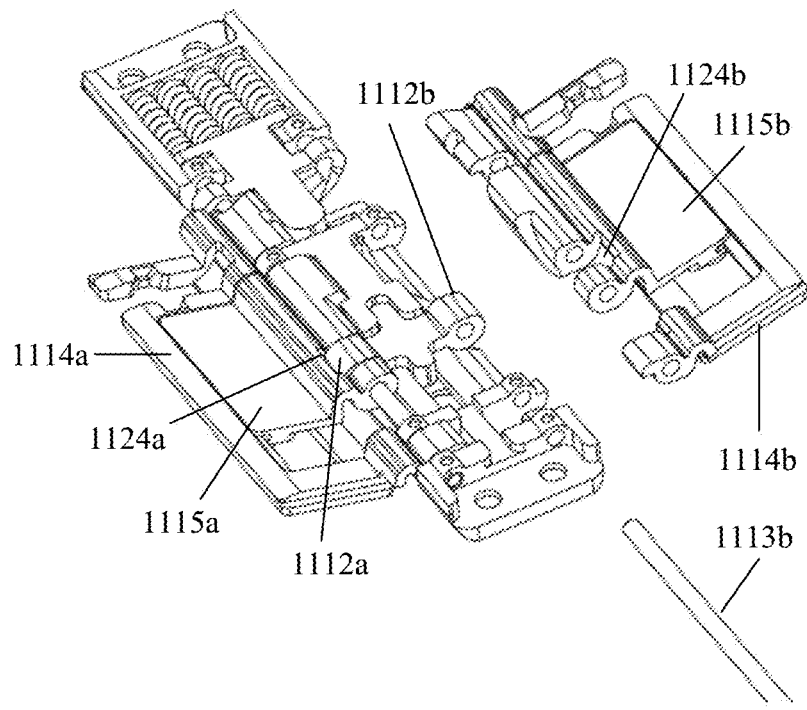
FIG. 12 is a diagram of another structure of a hinge mechanism according to an embodiment of this application.

FIG. 12 is a diagram of another structure of a hinge mechanism according to an embodiment of this application. As shown in FIG. 12, when the first rotating assembly 1111*a* is specifically disposed, the first spiral rotating part 1117*a* may be sleeved on the first rotating shaft 1113*a*. The first spiral rotating part 1117*a* is provided with a first limiting notch 1124*a*, and the first end 1112*a* of the sliding connection member 1112 is limited in the first limiting notch 1124*a*. The second spiral rotating part 1117*b* may be sleeved on the second rotating shaft 1113*b*. The second spiral rotating part 1117*b* is provided with a second limiting notch 1124*b*, and the second end 1112*b* of the sliding connection member 1112 is limited in the second limiting notch 1124*b*. When the first sliding member 1115*a* slides along the first rotating shaft 1113*a*, the first spiral rotating part 1117*a* may drive the first end 1112*a* of the sliding connection member 1112 to slide along the first rotating shaft 1113*a*, and when the second sliding member 1115*b* slides along the second rotating shaft 1113*b*, the second spiral rotating part 1117*b* may drive the second end 1112*b* of the sliding connection member 1112 to slide along the second rotating shaft 1113*b*, so that the sliding connection member 1112 slides along the first rotating shaft 1113*a* and the second rotating shaft 1113*b*.

Figure 13:
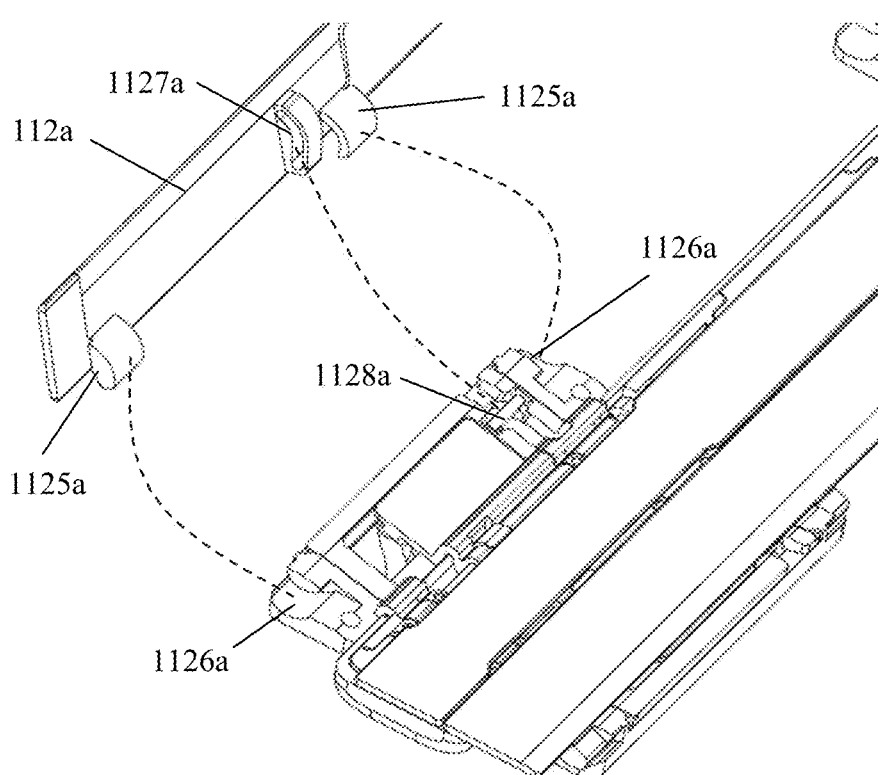
FIG. 13 is a diagram of another structure of a hinge mechanism according to an embodiment of this application.

FIG. 13 is a diagram of another structure of a hinge mechanism according to an embodiment of this application. As shown in FIG. 2 and FIG. 13, the hinge mechanism 11 may further include a first door plate 112*a* and a second door plate 112*b* that are oppositely disposed on the two sides of the base 110. The first door plate 112*a* is disposed close to the first rotating assembly 1111*a*, the second door plate 112*b* is disposed close to the second rotating assembly 1111*b*, and the first door plate 112*a* and the second door plate 112*b* are configured to provide support for the flexible display 12. Specifically, the first door plate 112*a* is rotatably connected to the first housing support 1116*a* and slidably connected to the first rotating member 1114*a*. The second door plate 112*b* is rotatably connected to the second housing support 1116*b* and slidably connected to the second rotating member 1114*b*. When the first rotating assembly 1111*a* and the second rotating assembly 1111*b* rotate toward each other, the first door plate 112*a* may rotate relative to the first housing support 1116*a* and slide relative to the first rotating member 1114*a*, and the second door plate 112*b* rotates relative to the second housing support 1116*b* and slides relative to the second rotating member 1114*b*. In this way, when the hinge mechanism 11 is in the folded state, the first door plate 112*a* and the second door plate 112*b* each are disposed at an included angle with the base 110, so that the first door plate 112*a*, the second door plate 112*b*, and the base 110 enclose triangle-like space, and then a part of the flexible display 12 is accommodated in the space in a water drop shape. It should be noted that the first door plate 112*a* and the second door plate 112*b* may be in contact with the base 110, or may not be in contact with the base 110. In other words, the included angle formed between the first door plate 112*a* and the base 110 may be an included angle formed when the first door plate 112*a* is in contact with the base 110, or may be an included angle formed between an extension line of the first door plate 112*a* and the base 110. The included angle is an acute angle. The included angle formed between the second door plate 112*b* and the base 110 may be an included angle formed when the second door plate 112*b* is in contact with the base 110, or may be an included angle formed between an extension line of the second door plate 112*b* and the base 110. The included angle is an acute angle.

As shown in FIG. 13, a first arc-shaped rotating block 1125*a* is provided on a side that is of the first door plate 112*a* and that is away from the flexible display 12, and a first arc-shaped guiding groove 1126*a* is provided on a side that is of the first housing support 1116*a* and that faces the first door plate 112*a*. The first arc-shaped rotating block 1125*a* may be accommodated in the first arc-shaped guiding groove 1126*a* and slide in the first arc-shaped guiding groove 1126*a*, to implement a rotating connection between the first door plate 112*a* and the first housing support 1116*a*. Correspondingly, a second arc-shaped rotating block is provided on a side that is of the second door plate 112*b* and that is away from the flexible display 12, and a second arc-shaped guiding groove is provided on a side that is of the second housing support 1116*b* and that faces the second door plate 112*b*. The second arc-shaped rotating block is accommodated in the second arc-shaped guiding groove and slides in the second arc-shaped guiding groove, to implement a rotating connection between the second door plate 112*b* and the second housing support 1116*b*.

Figure 14:
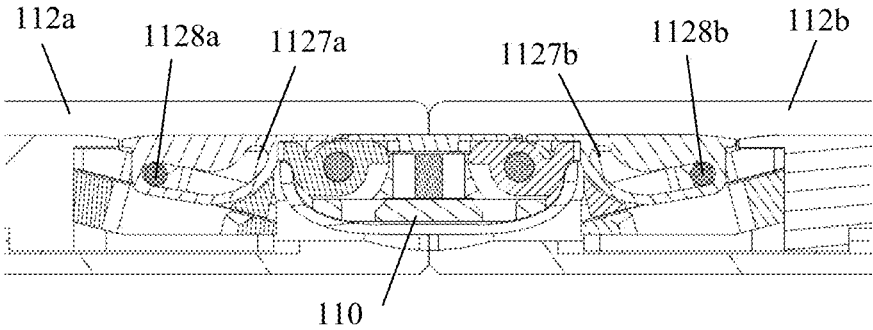
FIG. 14 is a diagram of an unfolded hinge mechanism according to an embodiment of this application.
Figure 15:
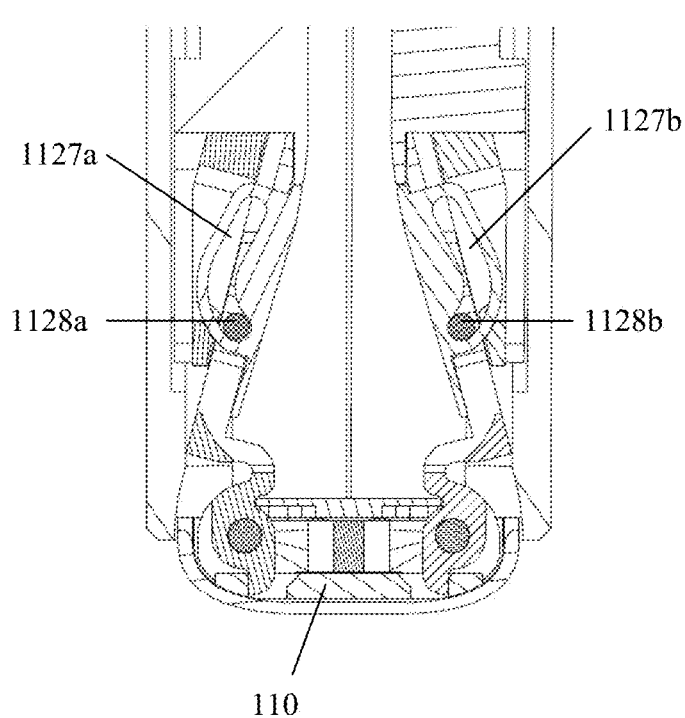
FIG. 15 is a diagram of a folded hinge mechanism according to an embodiment of this application.

FIG. 14 is a diagram of an unfolded hinge mechanism according to an embodiment of this application. FIG. 15 is a diagram of a folded hinge mechanism according to an embodiment of this application. As shown in FIG. 14 and FIG. 15, when the first housing support 1116*a* and the second housing support 1116*b* are folded toward each other or unfolded, the first door plate 112*a* and the second door plate 112*b* are also folded or unfolded along with the first housing support 1116*a* and the second housing support 1116*b*. When the flexible display 12 is specifically disposed, the flexible display 12 is located on a side of the hinge mechanism 11 and disposed close to the first door plate 112*a* and the second door plate 112*b*. There is a first support surface on a side that is of the first door plate 112*a* and that faces the flexible display 12, there is a second support surface on a side that is of the second door plate 112*b* and that faces the flexible display 12, and there is a third support surface on a side that is of the base 110 and that faces the flexible display 12. When the hinge mechanism 11 is in the unfolded state, the first support surface, the second support surface, and the third support surface may form a flat support surface for supporting the flexible display 12, to provide good support for the flexible display 12. This prevents the flexible display 12 from being depressed or arched.

As shown in FIG. 13, a first track groove 1127*a* may be further provided on the side that is of the first door plate 112*a* and that is away from the flexible display 12, and the first rotating member 1114*a* is provided with a first pin 1128*a*. The first pin 1128*a* is accommodated in the first track groove 1127*a* and slides in the first track groove 1127*a*, to drive the first door plate 112*a* to move relative to the first housing support 1116*a*. As shown in FIG. 14 and FIG. 15, correspondingly, a second track groove 1127*b* may be further provided on the side that is of the second door plate 112*b* and that is away from the flexible display 12, and the second rotating member 1114*b* is provided with a second pin 1128*b*. The second pin 1128*b* is accommodated in the second track groove 1127*b* and slides in the second track groove 1127*b*, to drive the second door plate 112*b* to move relative to the second housing support 1116*b*.

Terms used in the foregoing embodiments are merely intended to describe specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A hinge mechanism, wherein the hinge mechanism comprises a base, a first rotating assembly, and a second rotating assembly, and the first rotating assembly and the second rotating assembly are respectively disposed on two sides of the base;

the first rotating assembly comprises:

a first rotating shaft, disposed on a side of the base;

a first rotating member, rotatably connected to the base through the first rotating shaft;

a first sliding member, wherein an end is rotatably connected to the base, another end is slidably connected to the first rotating member, and the first sliding member is capable of sliding relative to the first rotating member in a direction parallel to the first rotating shaft; and a first housing support, slidably connected to the first rotating member, wherein the first housing support is capable of sliding relative to the first rotating member in a direction perpendicular to the first rotating shaft, wherein the first sliding member is provided with a first spiral rotating part, a first spiral groove is provided on a side that is of the base and that is close to the first sliding member, and the first spiral rotating part is accommodated in the first spiral groove and rotates in the first spiral groove, so that the first sliding member slides relative to the first rotating member in the direction parallel to the first rotating shaft; and one of the first housing support and the first sliding member is provided with a first slanting groove, the other of the first housing support and the first sliding member is provided with a first protrusion, and the first protrusion is capable of sliding in the first slanting groove, to push the first housing support to slide relative to the first rotating member in a direction away from the base when the first rotating assembly and the second rotating assembly rotate toward each other; and the second rotating assembly comprises:

a second rotating shaft, disposed on another side of the base and disposed in parallel to the first rotating shaft;

a second rotating member, rotatably connected to the base through the second rotating shaft;

a second sliding member, wherein an end is rotatably connected to the base, another end is slidably connected to the second rotating member, and the second sliding member is capable of sliding relative to the second rotating member in a direction parallel to the second rotating shaft; and a second housing support, slidably connected to the second rotating member, wherein the second housing support is capable of sliding relative to the second rotating member in a direction perpendicular to the second rotating shaft, wherein the second sliding member is provided with a second spiral rotating part, a second spiral groove is provided on a side that is of the base and that is close to the second sliding member, and the second spiral rotating part is accommodated in the second spiral groove and rotates in the second spiral groove, so that the second sliding member slides relative to the second rotating member in the direction parallel to the second rotating shaft; and one of the second housing support and the second sliding member is provided with a second slanting groove, the other of the second housing support and the second sliding member is provided with a second protrusion, and the second protrusion is capable of sliding in the second slanting groove, to push the second housing support to slide relative to the second rotating member in a direction away from the base when the first rotating assembly and the second rotating assembly rotate toward each other.

2. The hinge mechanism according to claim 1, wherein the hinge mechanism further comprises a sliding connection member, wherein a first limiting notch is provided on a side that is of the first sliding member and that is close to the first rotating shaft, an end of the sliding connection member is limited in the first limiting notch and sleeved on the first rotating shaft, a second limiting notch is provided on a side that is of the second sliding member and that is close to the second rotating shaft, and another end of the sliding connection member is limited in the second limiting notch and sleeved on the second rotating shaft; and when the first rotating assembly and the second rotating assembly rotate toward or opposite to each other, at least one of the first sliding member and the second sliding member pushes the sliding connection member to slide in a same direction on the first rotating shaft and the second rotating shaft, so that the sliding connection member pushes the first sliding member and the second sliding member to synchronously slide in a same direction.

3. The hinge mechanism according to claim 2, wherein the sliding connection member is in a cross shape or a straight shape.

4. The hinge mechanism according to claim 1, wherein the first sliding member is further provided with a first sliding groove parallel to the first rotating shaft, the first rotating member is provided with a first sliding part, and the first sliding part is accommodated in the first sliding groove and slides in the first sliding groove, to implement a sliding connection between the first rotating member and the first sliding member; and the second sliding member is provided with a second sliding groove parallel to the second rotating shaft, the second rotating member is provided with a second sliding part, and the second sliding part is accommodated in the second sliding groove and slides in the second sliding groove, to implement a sliding connection between the second rotating member and the second sliding member; or the first rotating member is provided with a third sliding groove parallel to the first rotating shaft, the first sliding member is further provided with a third sliding part, and the third sliding part is accommodated in the third sliding groove and slides in the third sliding groove, to implement a sliding connection between the first rotating member and the first sliding member; and the second rotating member is provided with a fourth sliding groove parallel to the second rotating shaft, the second sliding member is further provided with a fourth sliding part, and the fourth sliding part is accommodated in the fourth sliding groove and slides in the fourth sliding groove, to implement a sliding connection between the second rotating member and the second sliding member.

5. The hinge mechanism according to claim 1, wherein the first rotating member comprises a first frame body and a first rotating part, the first frame body encloses a first hollow area, the first frame body is separately slidably connected to the first sliding member and the first housing support, and the first rotating part is disposed on a side that is of the first frame body and that is close to the base, and is rotatably connected to the first rotating shaft;

the first sliding member comprises a first sliding block body, wherein the first sliding block body is disposed in the first hollow area of the first frame body, and the first spiral rotating part is disposed on a side that is of the first sliding block body and that is close to the base;

the second rotating member comprises a second frame body and a second rotating part, the second frame body encloses a second hollow area, the second frame body is separately slidably connected to the second sliding member and the second housing support, and the second rotating part is disposed on a side that is of the second frame body and that is close to the base, and is rotatably connected to the second rotating shaft; and the second sliding member comprises a second sliding block body, wherein the second sliding block body is disposed in the second hollow area of the second frame body, and the second spiral rotating part is disposed on a side that is of the second sliding block body and that is close to the base.

6. The hinge mechanism according to claim 5, wherein the first housing support is provided with the first slanting groove, and the first protrusion is disposed on the first sliding block body of the first sliding member, passes through the first hollow area, and is slidably connected to the first slanting groove; and the second housing support is provided with the second slanting groove, and the second protrusion is disposed on the second sliding block body of the second sliding member, passes through the second hollow area, and is slidably connected to the second slanting groove.

7. The hinge mechanism according to claim 5, wherein a shape of a cross section that is of the first protrusion and that is parallel to the first sliding block body is a circle, an ellipse, or a rectangle; and a shape of a cross section that is of the second protrusion and that is parallel to the second sliding block body is a circle, an ellipse, or a rectangle.

8. The hinge mechanism according to claim 1, wherein the first slanting groove extends in a direction away from the base from a side close to the base to a side away from the base, and forms a first included angle with the first rotating shaft, wherein the first included angle is an acute angle;

the second slanting groove extends in a direction away from the base, and forms a second included angle with the second rotating shaft, wherein the second included angle is an acute angle; and when the first rotating assembly and the second rotating assembly rotate toward each other, the first protrusion slides in the first slanting groove in a direction close to the base, and the second protrusion slides in the second slanting groove in a direction close to the base.

9. The hinge mechanism according to claim 1, wherein the first housing support is further provided with a first limiting sliding groove, the first limiting sliding groove extends in a direction away from the base, the first rotating member is provided with a first limiting sliding part, and the first limiting sliding part is accommodated in the first limiting sliding groove and slides in the first limiting sliding groove, to implement a sliding connection between the first housing support and the first rotating member; and the second housing support is further provided with a second limiting sliding groove, the second limiting sliding groove extends in a direction away from the base, the second rotating member is provided with a second limiting sliding part, and the second limiting sliding part is accommodated in the second limiting sliding groove and slides in the second limiting sliding groove, to implement a sliding connection between the second housing support and the second rotating member; or the first housing support is further provided with a third limiting sliding part, the first rotating member is provided with a third limiting sliding groove, the third limiting sliding groove extends in a direction away from the base, and the third limiting sliding part is accommodated in the third limiting sliding groove and slides in the third limiting sliding groove, to implement a sliding connection between the first housing support and the first rotating member; and the second housing support is further provided with a fourth limiting sliding part, the second rotating member is provided with a fourth limiting sliding groove, the fourth limiting sliding groove extends in a direction away from the base, and the fourth limiting sliding part is accommodated in the fourth limiting sliding groove and slides in the fourth limiting sliding groove, to implement a sliding connection between the second housing support and the second rotating member.

10. The hinge mechanism according to claim 1, wherein the hinge mechanism further comprises a first door plate and a second door plate that are oppositely disposed on the two sides of the base, the first door plate and the second door plate are configured to support a flexible display of an electronic device, the first door plate is rotatably connected to the first housing support and slidably connected to the first rotating member, and the second door plate is rotatably connected to the second housing support and slidably connected to the second rotating member; and when the first rotating assembly and the second rotating assembly rotate toward each other, the first door plate rotates relative to the first housing support and slides relative to the first rotating member, and the second door plate rotates relative to the second housing support and slides relative to the second rotating member, so that the first door plate and the second door plate each are disposed at an included angle with the base when the hinge mechanism is in a folded state.

11. The hinge mechanism according to claim 10, wherein there is a first support surface on a side that is of the first door plate and that faces the flexible display, there is a second support surface on a side that is of the second door plate and that faces the flexible display, and there is a third support surface on a side that is of the base and that faces the flexible display; and when the hinge mechanism is in an unfolded state, the first support surface, the second support surface, and the third support surface form a flat support surface for supporting the flexible display.

12. The hinge mechanism according to claim 10, wherein a first arc-shaped rotating block is provided on a side that is of the first door plate and that is away from the flexible display, a first arc-shaped guiding groove is provided on a side that is of the first housing support and that faces the first door plate, and the first arc-shaped rotating block is accommodated in the first arc-shaped guiding groove and slides in the first arc-shaped guiding groove, to implement a rotating connection between the first door plate and the first housing support; and a second arc-shaped rotating block is provided on a side that is of the second door plate and that is away from the flexible display, a second arc-shaped guiding groove is provided on a side that is of the second housing support and that faces the second door plate, and the second arc-shaped rotating block is accommodated in the second arc-shaped guiding groove and slides in the second arc-shaped guiding groove, to implement a rotating connection between the second door plate and the second housing support.

13. The hinge mechanism according to claim 10, wherein a first track groove is further provided on the side that is of the first door plate and that is away from the flexible display, the first rotating member is provided with a first pin, and the first pin is accommodated in the first track groove and slides in the first track groove, to drive the first door plate to move relative to the first housing support; and a second track groove is further provided on the side that is of the second door plate and that is away from the flexible display, the second rotating member is provided with a second pin, and the second pin is accommodated in the second track groove and slides in the second track groove, to drive the second door plate to move relative to the second housing support.

14. An electronic device, comprising a first housing, a second housing, a flexible display, and a hinge mechanism, wherein the first housing and the second housing are respectively disposed on two opposite sides of a base, the first housing is fastened to a first housing support, and the second housing is fastened to a second housing support; and the flexible display continuously covers the first housing, the second housing, and the hinge mechanism, and the flexible display is fastened to the first housing and the second housing; and wherein the hinge mechanism comprises a base, a first rotating assembly, and a second rotating assembly, and the first rotating assembly and the second rotating assembly are respectively disposed on two sides of the base;

the first rotating assembly comprises:

a first rotating shaft, disposed on a side of the base;

a first rotating member, rotatably connected to the base through the first rotating shaft;

a first sliding member, wherein an end is rotatably connected to the base, another end is slidably connected to the first rotating member, and the first sliding member is capable of sliding relative to the first rotating member in a direction parallel to the first rotating shaft; and a first housing support, slidably connected to the first rotating member, wherein the first housing support is capable of sliding relative to the first rotating member in a direction perpendicular to the first rotating shaft, wherein the first sliding member is provided with a first spiral rotating part, a first spiral groove is provided on a side that is of the base and that is close to the first sliding member, and the first spiral rotating part is accommodated in the first spiral groove and rotates in the first spiral groove, so that the first sliding member slides relative to the first rotating member in the direction parallel to the first rotating shaft; and one of the first housing support and the first sliding member is provided with a first slanting groove, the other of the first housing support and the first sliding member is provided with a first protrusion, and the first protrusion is capable of sliding in the first slanting groove, to push the first housing support to slide relative to the first rotating member in a direction away from the base when the first rotating assembly and the second rotating assembly rotate toward each other; and the second rotating assembly comprises:

a second rotating shaft, disposed on another side of the base and disposed in parallel to the first rotating shaft;

a second rotating member, rotatably connected to the base through the second rotating shaft;

a second sliding member, wherein an end is rotatably connected to the base, another end is slidably connected to the second rotating member, and the second sliding member is capable of sliding relative to the second rotating member in a direction parallel to the second rotating shaft; and a second housing support, slidably connected to the second rotating member, wherein the second housing support is capable of sliding relative to the second rotating member in a direction perpendicular to the second rotating shaft, wherein the second sliding member is provided with a second spiral rotating part, a second spiral groove is provided on a side that is of the base and that is close to the second sliding member, and the second spiral rotating part is accommodated in the second spiral groove and rotates in the second spiral groove, so that the second sliding member slides relative to the second rotating member in the direction parallel to the second rotating shaft; and one of the second housing support and the second sliding member is provided with a second slanting groove, the other of the second housing support and the second sliding member is provided with a second protrusion, and the second protrusion is capable of sliding in the second slanting groove, to push the second housing support to slide relative to the second rotating member in a direction away from the base when the first rotating assembly and the second rotating assembly rotate toward each other.

15. The electronic device according to claim 14, wherein the hinge mechanism further comprises a sliding connection member, wherein a first limiting notch is provided on a side that is of the first sliding member and that is close to the first rotating shaft, an end of the sliding connection member is limited in the first limiting notch and sleeved on the first rotating shaft, a second limiting notch is provided on a side that is of the second sliding member and that is close to the second rotating shaft, and another end of the sliding connection member is limited in the second limiting notch and sleeved on the second rotating shaft; and when the first rotating assembly and the second rotating assembly rotate toward or opposite to each other, at least one of the first sliding member and the second sliding member pushes the sliding connection member to slide in a same direction on the first rotating shaft and the second rotating shaft, so that the sliding connection member pushes the first sliding member and the second sliding member to synchronously slide in a same direction.

16. The electronic device according to claim 15, wherein the sliding connection member is in a cross shape or a straight shape.

17. The electronic device according to claim 14, wherein the first sliding member is further provided with a first sliding groove parallel to the first rotating shaft, the first rotating member is provided with a first sliding part, and the first sliding part is accommodated in the first sliding groove and slides in the first sliding groove, to implement a sliding connection between the first rotating member and the first sliding member; and the second sliding member is provided with a second sliding groove parallel to the second rotating shaft, the second rotating member is provided with a second sliding part, and the second sliding part is accommodated in the second sliding groove and slides in the second sliding groove, to implement a sliding connection between the second rotating member and the second sliding member; or the first rotating member is provided with a third sliding groove parallel to the first rotating shaft, the first sliding member is further provided with a third sliding part, and the third sliding part is accommodated in the third sliding groove and slides in the third sliding groove, to implement a sliding connection between the first rotating member and the first sliding member; and the second rotating member is provided with a fourth sliding groove parallel to the second rotating shaft, the second sliding member is further provided with a fourth sliding part, and the fourth sliding part is accommodated in the fourth sliding groove and slides in the fourth sliding groove, to implement a sliding connection between the second rotating member and the second sliding member.

18. The electronic device according to claim 14, wherein the first rotating member comprises a first frame body and a first rotating part, the first frame body encloses a first hollow area, the first frame body is separately slidably connected to the first sliding member and the first housing support, and the first rotating part is disposed on a side that is of the first frame body and that is close to the base, and is rotatably connected to the first rotating shaft;

the first sliding member comprises a first sliding block body, wherein the first sliding block body is disposed in the first hollow area of the first frame body, and the first spiral rotating part is disposed on a side that is of the first sliding block body and that is close to the base;

the second rotating member comprises a second frame body and a second rotating part, the second frame body encloses a second hollow area, the second frame body is separately slidably connected to the second sliding member and the second housing support, and the second rotating part is disposed on a side that is of the second frame body and that is close to the base, and is rotatably connected to the second rotating shaft; and the second sliding member comprises a second sliding block body, wherein the second sliding block body is disposed in the second hollow area of the second frame body, and the second spiral rotating part is disposed on a side that is of the second sliding block body and that is close to the base.

19. The electronic device according to claim 18, wherein the first housing support is provided with the first slanting groove, and the first protrusion is disposed on the first sliding block body of the first sliding member, passes through the first hollow area, and is slidably connected to the first slanting groove; and the second housing support is provided with the second slanting groove, and the second protrusion is disposed on the second sliding block body of the second sliding member, passes through the second hollow area, and is slidably connected to the second slanting groove.

20. The electronic device according to claim 18, wherein a shape of a cross section that is of the first protrusion and that is parallel to the first sliding block body is a circle, an ellipse, or a rectangle; and a shape of a cross section that is of the second protrusion and that is parallel to the second sliding block body is a circle, an ellipse, or a rectangle.

\* \* \* \* \*